United States Patent [19]

Takahashi et al.

[11] Patent Number: 5,336,585
[45] Date of Patent: Aug. 9, 1994

[54] PHOTOSENSITIVE RESIN COMPOSITION FOR USE IN FORMING A RELIEF STRUCTURE

[75] Inventors: Gensho Takahashi; Reijiro Sato, both of Fuji, Japan

[73] Assignee: Asahi Kasei Kogyo Kabushiki, Osaka, Japan

[21] Appl. No.: 999,578

[22] Filed: Dec. 30, 1992

Related U.S. Application Data

[63] Continuation of Ser. No. 579,952, Sep. 10, 1990, abandoned.

[30] Foreign Application Priority Data

Nov. 16, 1989 [JP] Japan ................... 1-296113

[51] Int. Cl.$^5$ ............................................. G03C 1/725
[52] U.S. Cl. ......................................... 430/284; 430/18; 522/96
[58] Field of Search .................... 430/284, 18; 522/96

[56] References Cited

U.S. PATENT DOCUMENTS

| | | |
|---|---|---|
| 3,960,572 | 6/1976 | Ibata et al. . |
| 4,006,024 | 2/1977 | Ibata et al. . |
| 4,418,138 | 11/1983 | Curtis .................. 430/283 X |
| 4,716,094 | 12/1987 | Minonishi et al. .................. 430/284 |

FOREIGN PATENT DOCUMENTS

| | | |
|---|---|---|
| 0125862 | 11/1984 | European Pat. Off. . |
| 0154994 | 9/1985 | European Pat. Off. . |
| 0263366 | 4/1988 | European Pat. Off. . |
| 2218352 | 9/1974 | France . |
| 55-127551 | 10/1980 | Japan . |
| 55-153936 | 12/1980 | Japan . |
| 60-24542 | 2/1985 | Japan . |
| 63-305346 | 12/1988 | Japan . |

*Primary Examiner*—Marion E. McCamish
*Assistant Examiner*—Mark A. Chapman
*Attorney, Agent, or Firm*—Birch, Stewart, Kolasch & Birch

[57] ABSTRACT

A photosensitive resin composition for use in forming a relief structure, which comprises, in specific proportions, a liquid photosensitive resin component comprising a urethane prepolymer and an addition-polymerizable ethylenically unsaturated monomer; a photopolymerization initiator; a thermal polymerization inhibitor; and a specific unsaturated amine compound. The photosensitive resin composition exhibits excellent performances such that it does not suffer from tunnel phenomenon which is frequently observed in relief formation with respect to conventional photosensitive resin compositions, so that a photoresin relief structure made therefrom not only is characterized with a tunnel-free structure and excellent mechanical properties, but also exhibits excellent performances.

6 Claims, 1 Drawing Sheet

FIG. I
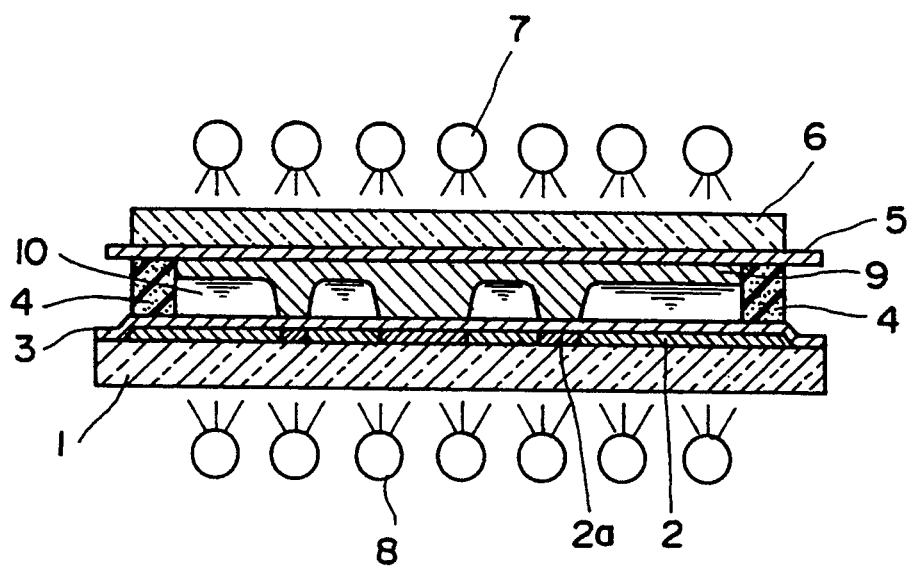
FIG. 2
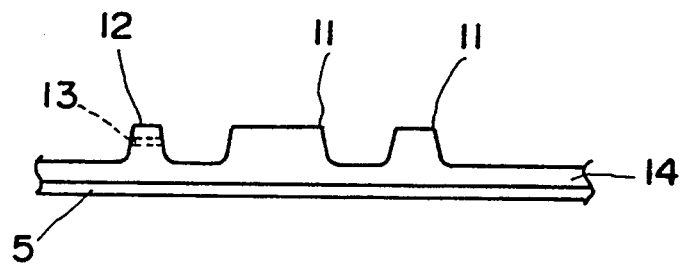

PHOTOSENSITIVE RESIN COMPOSITION FOR USE IN FORMING A RELIEF STRUCTURE

This application is a continuation of application Ser. No. 07/579,952 filed on Sep. 10, 1990, now abandoned.

BACKGROUND OF THE INVENTION

1. Field Of The Invention

The present invention relates to a novel photosensitive resin composition for use in forming a relief structure. More particularly, the present invention is concerned with a photosensitive resin composition which can advantageously be used for forming a relief structure without forming tunnel-like voids in the relief portions thereof, so that a relief structure having no undesired voids can be obtained.

2. Discussion Of Related Art

In recent years, the photosensitive resin industry has made rapid progress, and photosensitive resins are now utilized in a wide variety of fields. For example, photosensitive resins have been used as materials for producing a lithographic printing plate, a relief printing plate and a gravure printing plate, a mold and a relief article, and used as materials for forming etching resists useful in producing a printed circuit, an integrated circuit and a shadow mask, and also used as a photosensitive vehicle for a coating material, an adhesive and a printing ink.

Particularly, photoresin relief plates which are produced from a photosensitive resin are widely used in a variety of fields of printing in place of stereotypes, metallic plates and rubber plates which have been widely used. This is because a photoresin plate exhibits excellent performance such that not only can high printing speed and high quality impressions be obtained, but also cost is reduced and the working environment is improved. For example, photoresin relief plates are utilized in the field of commercial printing, such as newspaper printing, printing of business forms, printing of books and magazines, printing of labels and seals or printing of catalogs and posters as well as in the fields relating to the manufacture of a flexographic printing plate use, for example, in corrugated board printing and in the manufacture of stamps. Representative photoresin relief plates include a relief printing plate, a PS (presensitized) plate and a flexographic printing plate.

The above-mentioned photoresin relief plate and photoresin mold are generally prepared by imagewise exposing a photosensitive resin layer provided on a support to actinic rays through an image-bearing transparency, such as a negative film; washing out the unexposed (uncured) areas of the photosensitive resin layer with a developer (such as an organic solvent, an aqueous alkaline solution, an aqueous solution of a surfactant, or water); and effecting post-exposure treatment, followed by drying.

In the production of a photoresin relief plate having a large depth of relief and in the production of a photoresin mold, the amount of the photosensitive resin which is unexposed and therefore remains uncured after the imagewise exposure of the photosensitive resin layer, is large. Therefore, in such cases, a liquid photosensitive resin is frequently used rather than a sheet-type solid photosensitive resin. The use of a liquid photosensitive resin is advantageous in that not only is the liquid resin useful for producing a photoresin plate having a desired thickness but also its use allows for easy removal of the uncured resin, as compared with the use of a solid photosensitive resin.

Various types of liquid photosensitive resin compositions have been known for forming a relief plate or a relief mold. Particularly, for producing a photoresin relief plate or mold having not only a relief depth as large as 2 mm or more, but also a good balance of mechanical properties and an excellent light stability, there is widely used a polyester-polyether block urethane prepolymer having an addition-polymerizable ethylenically unsaturated group at both terminals thereof [see, for example, U.S. Pat. Nos. 3,960,572 and 4,006,024 (these U.S. Patents correspond to Japanese Patent Application Publication Nos. 52-7761, 52-36444, 54-9921 and 52-7363) and Japanese Patent Application Laid-Open Specification Nos. 55-127551 and 55-153936].

An example of processes for producing a relief plate or a relief mold, in which a liquid photosensitive resin composition is used, is described below, with reference to FIG. 1. In FIG. 1, a process is diagrammatically illustrated for producing a relief plate by using a liquid photosensitive resin composition. First, image-bearing transparency 2 (such as a negative film) having transmitting pattern 2a is placed on lower glass plate 1, and image-bearing transparency 2 is pressed onto glass plate 1 by means of cover film 3. Spacer 4 is disposed on cover film 3 along the periphery of cover film 3 and a liquid photosensitive resin is poured onto cover film 3 into the cavity formed by spacer 4. Support 5 is laminated onto the resultant photosensitive resin layer. Then, an upper light source box which contains upper glass plate 6 and upper light source 7 is pulled down, so that upper glass plate 6 is pressed against support 5 to adjust the thickness of the photosensitive resin layer to a desired thickness defined by the thickness of spacer 4. The photosensitive resin layer having a desired thickness is irradiated with actinic rays emitted from upper light source 7, thereby effecting back exposure to control the relief depth (which means the distance between the top of relief portion 11 and the upper surface of base layer 14 in FIG. 2), and then irradiated with actinic rays emitted from lower light source 8, to thereby effect imagewise exposure for forming a relief. Numerals 9 and 10 designate the cured portion and uncured portion of the photosensitive resin layer, respectively. Subsequently, the photoresin layer is subjected to development, post exposure and drying, thereby obtaining a desired photoresin relief plate or a photoresin relief mold.

However, in the above-mentioned process for the production of a photoresin relief plate or a photoresin relief mold by the use of a liquid photosensitive resin, when a conventional photosensitive resin composition based on the above-mentioned polyester-polyether block urethane prepolymer, is employed to form a photosensitive resin layer, a phenomenon is frequently observed such that particularly with respect to relief portions having a relatively small width, such as a fine-line image or letter, relief formation is accompanied by the formation of tunnel-like voids at a middle portion of the height (depth) of the relief or at a lower portion of the relief, which lower portion is near the base layer (or near the support when no base layer is formed). This phenomenon is hereinafter referred to as "tunnel phenomenon". Conventional photosensitive resin compositions are likely to suffer from the tunnel phenomenon, especially when their relief depth is greater than about 1.5 mm.

The reason why tunnel phenomenon occurs when conventional photosensitive resin compositions are used, is believed to reside in the fact that conventional photosensitive resin compositions, when being exposed to actinic radiation, cannot form a preliminary semi-cured structure throughout the thickness of the resin layer in the course of the curing toward the final three-dimensional structure, which semi-cured structure exhibits mechanical strength sufficient to resist the flow of the resin. That is, a conventional photosensitive resin composition is three-dimensionally cured, without forming such a semi-cured structure during the course of the curing, when it absorbs a considerable amount of actinic rays, wherein after the amount of irradiated actinic rays reaches a threshold value, the rate of the formation of three-dimensional structure sharply rises to lose the balance of the cured portion and the uncured portion, thereby causing the uncured portion of the resin to flow out of its original position to form a void, i.e., a tunnel. It should be noted that the tunnel phenomenon cannot be suppressed simply by improving the sensitivity of a photosensitive resin composition, particularly when the relief depth is greater than about 1.5 mm.

FIG. 2 diagrammatically shows a side view of a relief plate having a defective relief portion in which a tunnel-like void (hereinafter referred to simply as "tunnel") is formed. In the relief plate of FIG. 2, the photoresin relief layer provided on support 5 comprises base layer 14 and, formed thereon, desired perfect relief portion 11 and defective relief portion 12 which has tunnel 13 (a hole formed in the relief portion).

When a relief plate having a tunnel, such as the relief plate shown in FIG. 2, is utilized as a printing plate to conduct relief printing, serious problems are likely to occur such that a sufficient printing pressure cannot be exerted on the defective relief portion having the tunnel, so that the inking and ink transferability of the relief portion becomes unsatisfactory or the defective relief portion is broken and comes off during the printing operation. On the other hand, when such a defective relief structure having a tunnel is used as a mold, problems are likely to be encountered such that when a liquid or powdery material to be molded is poured into the mold, the material flows into the tunnel and solidifies therein, so that the resultant molded article cannot be released from the mold. Further, when the defective mold having a tunnel is used for producing a sheet with a relief by a sheet molding method, it is likely that the applied pressure is not effectively exerted on the top portion of the defective relief due to the presence of the tunnel, so that a molded sheet having a desired high precision relief cannot be obtained.

It is known that the occurrence of tunnel phenomenon can be suppressed by increasing the time for exposure for producing a relief. However, even when the time for the relief-forming exposure is increased, it is not possible to completely suppress the occurrence of tunnel phenomenon. Moreover, an increase in the time for relief-forming exposure inevitably causes excessive exposure of the photosensitive resin composition, so that the breadths or widths of the screen dark portions (shadow portions) and complicated letter portions of the relief disadvantageously become large and the breadths or widths of the reverse image portions of the relief disadvantageously become small, so that a relief pattern with high precision cannot be obtained with high resolution.

In order to suppress the occurrence of tunnel phenomenon, it has also been attempted to use a light source having a high intensity for relief-forming exposure, and successful results have been obtained to some extent. However, a light source having a high intensity is expensive, and when the area of the photosensitive resin to be exposed to light is large, the cost of the light source inevitably becomes large, thereby rendering it impossible to utilize this method practically.

It is possible to repair a defective photoresin relief having a tunnel by a method in which an uncured photosensitive resin is filled in the tunnel and irradiated with actinic rays to thereby cure the filled photosensitive resin. However, this method is disadvantageous in that it can be performed only by a worker who is very skilled with this cumbersome repair operation, and it requires additional time. Therefore, this method cannot be practically employed to solve the problem of the occurrence of tunnel phenomenon.

It has also been proposed to employ a photosensitive resin composition comprising a combination of a special monomer having a low cure-shrinkage properties and a sensitizer for suppressing the occurrence of tunnel phenomenon (see Japanese Patent Application Laid-Open Specification No. 60-24542). This method is effective for suppressing the occurrence of tunnel phenomenon of a type which is caused due to the shrinkage of the photosensitive resin composition upon curing thereof. However, this method cannot effectively prevent tunnel phenomenon of another type which is caused due not to the cure-shrinkage of the photosensitive resin but to the flowing of the photosensitive resin during the curing reaction.

It has also been proposed to incorporate a tertiary amine having no addition-polymerizable ethylenically unsaturated double bond into a photosensitive resin composition in order to increase the photopolymerization rate of the resin composition. However, this method is disadvantageous in that the occurrence of tunnel phenomenon cannot be satisfactorily suppressed. Moreover, since the above-mentioned tertiary amine having no addition-polymerizable ethylenically unsaturated double bond, does not serve as a copolymerizable monomer, the tertiary amine remains unreacted in the cured photoresin relief even if the amount of the tertiary amine used is small, so that the smell of the amine, which is known to be very unpleasant, is emitted from the ultimate relief structure, which inevitably limits the use of the ultimate relief structure product.

Further, it has been proposed to incorporate acrylamide or methacrylamide substituted with N-dialkylaminoalkyl into a photosensitive resin composition in order to improve the properties of the ultimate relief structure product (see Japanese Patent Application Laid-Open Specification No. 63-305346). The incorporation of acrylamide or methacrylamide substituted with N-dialkylaminoalkyl into a photosensitive resin composition exhibits some effectiveness of increasing the sensitivity of the composition. However, this method has no effect of suppression of the occurrence of tunnel phenomenon.

SUMMARY OF THE INVENTION

The present inventors have made extensive and intensive studies with a view toward developing a liquid photosensitive resin composition which is capable of forming a relief structure without the danger that tunnel phenomenon occurs at the time of relief formation. As a result, it has unexpectedly been found that when a specific unsaturated amine compound is incorporated, in a specific amount, into a photosensitive resin composition comprising a liquid photosensitive resin component, a photopolymerization initiator and a thermal polymerization inhibitor, the resultant photosensitive resin composition, when being exposed to actinic radiation, is capable of forming a preliminary semi-cured structure throughout the thickness of the resin layer in the course of the curing toward the final three-dimensional structure, which semi-cured structure exhibits mechanical strength sufficient to resist the flow of the resin, and that such a photosensitive resin composition does not suffer from tunnel phenomenon at the time of photocuring and can advantageously be used for forming a relief structure without danger of the occurrence of tunnel phenomenon, so that an excellent relief structure free of tunnel defects can be obtained. The present invention has been completed on the basis of this novel finding.

It is, accordingly, an object of the present invention to provide a photosensitive resin composition for use in forming a relief structure having no tunnel defects, which relief structure can advantageously be used as a printing plate, a mold and other relief articles.

The foregoing and other objects, features and advantages will be apparent to those skilled in the art from the following detailed description and claims taken in connection with the accompanying drawings.

BRIEF DESCRIPTION OF THE DRAWINGS

In the drawings:

FIG. 1 is a diagrammatic cross-sectional illustration showing a process for producing a relief plate using a liquid photosensitive resin composition; and FIG. 2 is a diagrammatic side view of a defective relief plate having an undesired void (tunnel) formed in the relief structure.

DETAILED DESCRIPTION OF THE INVENTION

According to the present invention, there is provided a photosensitive resin composition for use in forming a relief structure, comprising:

(A) a liquid photosensitive resin component comprising:
  (a) 100 parts by weight of a urethane prepolymer comprising a plurality of diol segments linked through a urethane linkage and having an addition-polymerizable ethylenically unsaturated group at both terminals thereof, the plurality of diol segments comprising at least one polyoxyalkylene diol segment and at least one saturated polyester diol segment, the urethane prepolymer having a number average molecular weight of from $2.0 \times 10^3$ to $3.0 \times 10^4$, and
  (b) 10 to 200 parts by weight, relative to 100 parts by weight of urethane prepolymer (a), of an addition-polymerizable ethylenically unsaturated monomer, (B) 0.1 to 10 parts by weight, relative to 100 parts by weight of resin component (A), of a photopolymerization initiator, (C) 0.01 to 5 parts by weight, relative to 100 parts by weight of resin component (A), of a thermal polymerization inhibitor; and (D) 0.1 to 5 parts by weight, relative to 100 parts by weight of resin component (A), of at least one unsaturated amine compound represented by the formula:

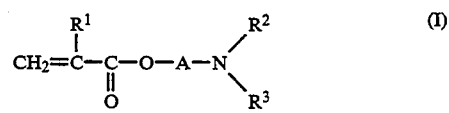

wherein $R^1$ represents a hydrogen atom or a methyl group, $R^2$ and $R^3$ each represent an alkyl group, and A represents a straight chain or branched alkylene group.

Resin component (A) of the photosensitive resin composition of the present invention comprises urethane prepolymer (a) and addition-polymerizable ethylenically unsaturated monomer (b). The above-mentioned urethane prepolymer (a) comprises a plurality of diol segments linked through a urethane linkage and has an addition-polymerizable ethylenically unsaturated group at both terminals thereof, and the plurality of diol segments comprise at least one polyoxyalkylene diol segment and at least one saturated polyester diol segment.

In the present invention, the terminology "urethane linkage" is used to define a linkage represented by the formula:

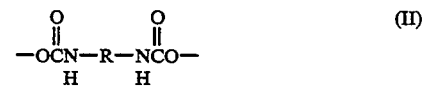

wherein R represents a bifunctional group derived from the diisocyanate used for forming a urethane prepolymer.

It is requisite that the urethane prepolymer has a number average molecular weight of from $2.0 \times 10^3$ to $3.0 \times 10^4$. When the number average molecular weight of the prepolymer is less than $2.0 \times 10^3$, the viscosity of the resin composition is too low and hence the flowability thereof is too high, so that it becomes difficult to form a photosensitive resin layer to be exposed to actinic rays in the relief-producing operation, since such a resin composition disadvantageously flows out of the spacer. On the other hand, when the number average molecular weight of the prepolymer is greater than $3.0 \times 10^4$, the viscosity of the prepolymer is too high, also rendering difficult the formation of a photosensitive resin layer. Further, when the number average molecular weight is greater than $3.0 \times 10^4$, the distance between double bonds is too large, so that the mechanical strength of the ultimate relief structure is likely to be disadvantageously lowered.

In the present invention, the number average molecular weight is obtained by gel permeation chromatography (GPC) in which a calibration curve prepared using standard polystyrene is employed. The conditions for the measurement of the number average molecular weight are as follows. A polystyrene gel is packed in a column, and tetrahydrofuran containing no water is used as a solvent. The concentration of a sample is 0.2–0.4%. With respect to the preparation of the calibration curve, the concentration of the standard polystyrene is about a half of the concentration of the sample. The preparation of the calibration curve and the measurement of the sample are conducted in the same day. Measurement is conducted at least two times per sample, and the average of at least two values obtained are indicated with two significant figures.

There is no particular limitation with respect to the molecular weight of the polyoxyalkylene diol which forms one type of diol segment of the urethane prepolymer. However, in general, a polyoxyalkylene diol having a number average molecular weight of from $5.0 \times 10^2$ to $5.0 \times 10^3$ is preferably employed from the viewpoint of ease in controlling the urethane reaction and of having a good balance between the viscosity of the urethane prepolymer and the mechanical properties of the ultimate relief structure.

Examples of polyoxyalkylene diols to be used in the present invention include polyoxyethylene glycol (PEG), polyoxypropylene glycol (PPG), polyoxyethylenepropylene glycol random or block copolymer, polyoxytetramethylene glycol (PTMG), polyoxyethylene-tetraethylene glycol random or block copolymer, polyoxypropylene-tetraethylene glycol random or block copolymer.

There is no particular limitation with respect to the number of the carbon atoms in the alkylene group of the polyoxyalkylene diol. However, it is preferred that the number of the carbon atoms in the alkylene group is 4 to 20, preferably 4 to 10, from the viewpoint of the desired water resistance of the ultimate relief structure.

There is no particular limitation with respect to the molecular weight of the saturated polyester diol which forms another type of diol segment of the urethane prepolymer. However, in general, a saturated polyester diol having a number average molecular weight of $5.0 \times 10^2$ to $5.0 \times 10^3$ is preferably employed from the viewpoint of ease in controlling the urethane reaction and of having a good balance between the viscosity of the urethane prepolymer and the mechanical properties of the ultimate relief structure.

Examples of saturated polyester diols to be used in the present invention include a polyester diol obtained by condensation reaction of saturated dicarboxylic acid and alkylene glycol or oxyalkylene glycol, e.g., polyethylene adipate diol, polydiethylene glycol adipate diol, polybutylene adipate diol, poly-1,6-hexaneglycol adipate diol, polyneopentyl glycol adipate diol and polypropylene adipate diol. Further examples of saturated polyester diols include lactone-type polyester diols, such as those obtained by ring-opening polymerization of 5-membered, 6-membered and 7 or more-membered ring lactones, such as $\beta$-propiolactone, or a substitution product thereof, $\delta$-valerolactone or a substitution product thereof and $\epsilon$-caprolactone or a substitution product thereof. Of these, caprolactone polyester diol obtained from $\epsilon$-caprolactone is preferred from the viewpoint of availability.

It is requisite that the polyester diol is saturated. The reason therefor is as follows.

When an ethylenically unsaturated double bond is present in the polyester diol a, crosslinking reaction occurs not only at both terminals of the urethane prepolymer but also at a middle portion of the urethane prepolymer, thereby causing the cured resin to be too hard. When the amount of an ethylenically unsaturated monomer as component (b) is decreased in order to impart the cured resin with softness, the tensile strength of the cured resin is disadvantageously lowered, thereby rendering it difficult to obtain a cured resin having a good balance of hardness and tensile strength. On the other hand, when an aromatic ring structure is contained in the polyester diol, the viscosity of the urethane prepolymer and hence the viscosity of the photosensitive resin composition inevitably becomes high, so that operations, such as deaeration of the resin, removal of the resin from a container and formation of a resin layer to be subjected to light exposure, become difficult and time consuming. Moreover, when the polyester diol has an aromatic ring structure, the cured resin becomes poor in flexibility, which makes it extremely difficult to obtain a cured resin having improved resilience.

As described above, urethane prepolymer (a) has a structure such that a plurality of diol segments are linked through a urethane linkage. With respect to the diisocyanate to be used for linking diol segments through a urethane linkage, there can be mentioned, for example, tolylene diisocyanate (TDI)(2,4-TDI; 2,6-TDI; and a mixture of 2,4-TDI and 2,6-TDI), methylene-bis diisocyanate (MDI), 1,5-naphthalene diisocyanate (NDI), and tolidine diisocyanate (TODI), and hydrogenation products thereof; hexamethylene diisocyanate (HMDI), isophorone diisocyanate (IPDI), p-phenylene diisocyanate, transcyclohexane diisocyanate, xylylene diisocyanate, trimethylhexamethylene diisocyanate (TMDI) and the like. Of these diisocyanates, TDI, MDI, HMDI and IPDI are preferred from the viewpoint of availability and economy. When it is desired to obtain a relief structure which does not suffer from discoloration or yellowing, HMDI, IPDI, hydrogenated TDI and hydrogenated MDI are preferred.

Urethane prepolymer (a) has an addition-polymerizable ethylenically unsaturated group at both terminals thereof. With respect to the method for introducing the addition-polymerizable ethylenically unsaturated group, there is no limitation, and any of the conventional methods can be employed. For example, there may be mentioned a method in which a saturated polyester diol and a polyoxyalkylene diol are linked by means of a diisocyanate to obtain a precursor prepolymer, and both terminals of the precursor prepolymer are changed to isocyanate groups and the precursor prepolymer is reacted with a compound containing both a functional group having active hydrogen, such as a hydroxyl group, and an addition-polymerizable ethylenically unsaturated group, thereby obtaining a prepolymer having an addition-polymerizable ethylenically unsaturated group at both terminals thereof. Alternatively, there may be employed a method in which both terminals of the above-mentioned precursor prepolymer are changed to hydroxyl groups and the precursor prepolymer is then reacted with a compound which has both a functional group capable of reacting with a hydroxyl group, such as a carboxyl group, isocyanate group and epoxy group, and an addition-polymerizable ethylenically unsaturated group, thereby obtaining a prepolymer having an addition-polymerizable ethylenically unsaturated group at both terminals thereof.

Examples of the above-mentioned compound containing both a functional group having active hydrogen, such as a hydroxyl group, and an addition-polmerizable ethylenically unsaturated group include 2-hydroxyethyl (meth)acrylate, 2-hydroxypropyl (meth)acrylate, polyoxypropylene glycol mono(meth)acrylate ($\overline{Mn}$: $3.0 \times 10^2$ to $1.0 \times 10^3$), polyoxyethylene glycol mono(meth)acrylate ($\overline{Mn}$: $3.0 \times 10^2$ to $1.0 \times 10^3$), a 1:1 addition-polymerization reaction product of glycolic acid with glycidyl (meth)acrylate, a 1:1 addition-polymerization reaction product of glyceric acid with glycidyl (meth)a- crylate, glycerin di(meth)acrylate, allyl alcohol and (meth)acrylic acid. When an unsaturated compound having two hydroxyl groups, such as glycerol monomethacrylate, is used as a vinylating agent, after the introduction of a vinyl group, a carboxyl group can be introduced to the prepolymer by esterifying the remaining hydroxyl group by using an anhydride of a di-or higher carboxylic acid. Such a prepolymer having a carboxylic group introduced thereto is advantageous when development of the relief after the imagewise exposure is to be conducted using an aqueous developer.

In urethane prepolymer (a), the molar ratio of the saturated polyester diol segment to the polyoxyalkylene diol segment is generally from 1:4 to 4:1 from the viewpoint of the desired mechanical properties of the ultimate relief structure.

As described above, it is requisite that resin component (A) comprises urethane prepolymer (a) and addition-polymerizable ethylenically unsaturated monomer (b).

Examples of addition-polymerizable ethylenically unsaturated monomers which are used as monomer component (b) of the photosensitive resin composition of the present invention, include the following known ethylenically unsaturated monomers:

(1) unsaturated carboxylic acids and esters thereof, such as acrylic acid and methacrylic acid, alkyl acrylate, alkyl methacrylate, cycloalkyl acrylate, cycloalkyl methacrylate, alkyl halide acrylate, alkyl halide methacrylate, alcoxyalkyl acrylate, alcoxyalkyl methacrylate, hydroxyalkyl acrylate, hydroxyalkyl methacrylate, tetrahydrofurfuryl acrylate, tetrahydrofurfuryl methacrylate, allyl acrylate, allyl methacrylate, glycidyl acrylate, glycidyl methacrylate, benzyl acrylate, benzyl methacrylate, phenoxy acrylate, phenoxy methacylate, mono- or di-acrylate of alkylene glycol, mono- or di-methacrylate of alkylene glycol, mono- or di- acrylate of polyoxyalkylene glycol, mono- or di- methacrylate of polyoxyalkylene glycol, trimethylolpropane triacrylate, trimethylolpropane trimethacrylate, pentaerythritol tetraacrylate, and pentaerythritol tetramethacrylate;

(2) acrylamides, methacrylamides and derivatives thereof, such as an acrylamide N-substituted with an alkyl or hydroxyalkyl group, a methacrylamide N- substituted with analkyl or hydroxyalkyl group, an acrylamide N,N'-disubstituted with alkyl and/or hydroxyalkyl groups, a methacrylamide N,N'-disubstituted with alkyl and/or hydroxyalkyl groups, diacetone acrylamide, diacetone methacrylamide, N,N'- alkylene-bis-acrylamide, and N,N'-alkylene-bis- methacrylamide;

(3) allyl compounds, such as allyl alcohol, allyl isocyanate, diallyl phthalate and triallyl cyanurate;

(4) maleicacid, maleic anhydride, fumaric acid, and esters thereof, for example, mono- or di-alkyl maleate, mono- or di-alkyl fumarate, mono- or di-haloalkyl maleate, mono- or di-haloalkyl fumarate, mono- or di-alkoxyalkyl maleate, and mono- or di-alkoxyalkyl fumarate; and (5) other unsaturated compounds, such as styrene, vinyltoluene, divinylbenzene, N-vinylcarbazole and N-vinyl-pyrrolidone.

When a resin composition which does not suffer from cure-shrinkage during exposure is desired, as addition-polymerizable ethylenically unsaturated monomer (b), it is preferred to employ, for example, isobornyl(meth)acrylate, norbornyl(meth)acrylate, dicyclopentenoxyethyl(meth)acrylate, dicyclopentenoxypropyl(meth)acrylate, (meth)acrylic ester of diethylene glycol dicyclopentenyl monoether, (meth)acrylic ester of polyoxyethylene glycol dicyclopentenyl monoether, (meth)acrylic ester of polypropylene glycol dicyclopentenyl monoether, dicyclopentenyl cinnamate, dicyclopentenoxyethyl cinnamate, dicyclopentenoxyethyl mono- or di- fumarate, 3,9-bis(1,1-bismethyl-2-oxyethyl)-spiro[5,5]undecane mono- or di- (meth)acrylate, 3,9-bis(1,1-bismethyl-2-oxyethyl)-2,4,8,10-tetraoxaspiro[5,-5]undecane mono- or di- (meth)acrylate, 3,9-bis(2-oxyethyl)-spiro[5,5]undecane mono- or di- (meth)acrylate, 3,9-bis(2-oxyethyl)-2,4,8-10-tetraoxaspiro[5,5]undecane mono- or di-(meth)acrylate, mono- or di(meth)acrylic ester of a product obtained by addition-polymerization of each of the above spiro glycols with ethylene oxide, methyl ether of the above mono(meth)acrylates, 1-azabicyclo[2,2,2]-3-octenyl(meth)acrylate, bicyclo[2,2,1]-5-heptene-2,3-dicarboxyl monoallyl ester, dicyclopentadienyl (meth)acrylate, dicyclopentadienyl oxyethyl (meth)acrylate, and dihydrodicyclopentadienyl (meth)acrylate. Of these monomers, the compounds represented by the following formulae are preferred from the view,point of the desired effect and availability:

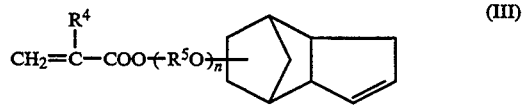
(III)

wherein $R^4$ represents a hydrogen atom or a methyl group, $R^5$ represents

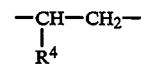

and n represents an integer of from 1 to 5, and

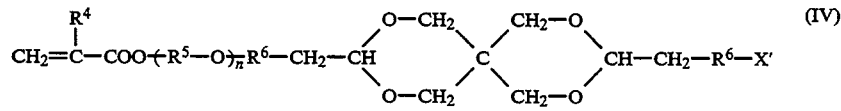
(IV)

wherein $R^4$ and $R^5$ have the same meanings as defined above, $R^6$ represents

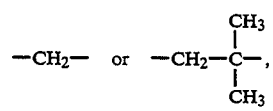

$X'$ represents a hydroxyl group, an alkoxy group having 1 to 3 carbon atoms or

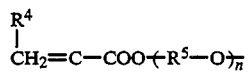

$$CH_2=C-COO(R^5-O)_n$$
           |
           $R^4$ and n represents an integer of from 1 to 5.

These addition-polymerizable ethylenically unsaturated monomers may be employed individually or in combination.

The amount of addition-polymerizable ethylenically unsaturated monomer (b) is selected in the range of from 10 to 200 parts by weight, preferably from 20 to 100 parts by weight, relative to 100 parts by weight of urethane prepolymer (a).

Various photopolymerization initiators as customarily used can be employed as component (B) of the photosensitive resin composition of the present invention. Representative examples of photopolymerization initiators include benzoin; benzoin alkyl ethers, such as benzoin ethyl ether, benzoin n-propyl ether, benzoin isopropyl ether and benzoin isobutyl ether; 2,2-dimethoxy-2-phenylacetophenone; benzophenone; benzil; diacetyl; and the like. These initiators may be used either individually or in combination. The amount of the photopolymerization initiator is selected in the range of from 0.1 to 10 parts by weight, relative to 100 parts by weight of resin component (A).

Various thermal polymerization inhibitors as customarily used can be employed as component (C) of the photosensitive resin composition of the present invention. Examples of thermal polymerization inhibitors include hydroquinone, mono-tert-butyl-hydroquinone, benzoquinone, 2,5-diphenyl-p-benzoquinone, picric acid, di-p-fluorophenyl-amine, di-p-methoxyphenol, 2,6-di-tert-butyl-p-cresol and the like. These inhibitors may be used either individually or in combination. The thermal polymerization inhibitors are added for preventing thermal polymerization reactions (reactions in the darkness). Accordingly, the amount of any thermal polymerization inhibitor is such as will be effective for inhibiting thermal polymerization, i.e., 0.01 to 5 parts by weight, relative to 100 parts by weight of resin component (A).

It is requisite that the photosensitive resin composition of the present invention comprise at least one unsaturated amine compound (D) of formula (I) in addition to resin component (A), photopolymerization initiator (B) and thermal polymerization inhibitor (C).

In formula (I), $R^2$ and $R^3$ are the same or different, and each independently represent an alkyl group. The number of the carbon atoms of the alkyl group is preferably in the range of from 1 to 10. Preferable examples of alkyl groups include a methyl group, an ethyl group, a propyl group, a butyl group, an isobutyl group, a pentyl group, an isopentyl group, an octyl group, a decyl group and an isodecyl group.

In formula (I), the alkylene group designated by character A may be of a straight chain or branched type. The number of the carbon atoms of the alkylene group is preferably in the range of from 1 to 10.

Representative examples of unsaturated amine compounds include N,N-dimethylaminoethyl (meth)acrylate, N,N-diethylaminoethyl (meth)acrylate, N,N-dipropylaminopropyl (meth)acrylate and di-propylaminobutyl (meth)acrylate. The unsaturated amine compounds may be used individually or in combination.

The amount of unsaturated amine compound (D) is selected in the range of from 0.1 to 5 parts by weight, relative to 100 parts by weight of resin component (A).

When the amount of unsaturated amine compound (D) is less than 0.1 part by weight, the effect aimed at by the present invention cannot be sufficiently attained, whereas when the amount is more than 5 parts by weight, it is likely that the photopolymerization rate of the resin composition is disadvantageously affected, leading to a lowering of resolution and that the exposure latitude of the resin composition is lowered. (herein, the term "exposure latitude" means the capability for a photosensitive resin composition to provide a cured product having desired properties even when the amount of irradiated actinic rays is varied.) Further, when the amount of unsaturated amine compound (D) is more than 5 parts by weight, the amine smell of the resin composition is disadvantageously strong and hence, the working environment becomes unpleasant due to the smell diffused from the resin. Furthermore, the strong amine smell usually remains even in the ultimate relief product. This is particularly disadvantageous when the relief product is to be used as a decorative relief article.

In addition to urethane prepolymer (a) and monomer (b), resin component (A) may optionally comprise other prepolymers and binder polymers.

Examples of such optional prepolymers include an ethylenically unsaturated polyester, an oligoester (meth)acrylate, an ethylenically unsaturated polyamide, an ethylenically unsaturated polyimide, ethylenically unsaturated polyether, ethylenically unsaturated poly(-meth)acrylate and modified products thereof; and an ethylenically unsaturated rubber compound having a carbon-carbon double bond. As the optional prepolymer, those having a number average molecular weight of about $5.0 \times 10^2$ or more is generally employed.

As the optional binder polymer, there can be mentioned, for example, a polymer obtained by removing the ethylenically unsaturated group from the above-mentioned optional prepolymers, a water-soluble polyamide, an alcohol-soluble polyamide, cellulose, acylated cellulose, etherified cellulose and petroleum resin.

The photosensitive resin composition of the present invention may further contain an ultraviolet absorber, a dye, a pigment, an inorganic filler, a lubricant and a surfactant as long as such additives do not impair or adversely affect the composition of the present invention. For example, a fatty acid, a fatty amide or a dialkyl thiodipropionate may be added to the photosensitive resin composition in order to improve surface properties, such as wetting properties and low surface tack; and mechanical properties, such as flexibility.

A preferred example of the method for producing a relief printing plate by using the photosensitive resin composition of the present invention is now explained with reference to FIG. 1. The method comprises the steps of:

(1) lamination in which an image-bearing transparency 2 (e.g., a negative film) is disposed on lower glass plate transparent to actinic rays, and covered with thin transparent protective film 3; spacer 4 is disposed on protective film 3 along its periphery; and the photosensitive resin composition of the present invention is poured into the cavity formed by spacer 4; and a support is laminated on the poured resin composition by a roll laminating method, while simultaneously leveling the resin composition into a layer with a predetermined thickness by applying a pressure to the resin composition by means of the roller used in the laminating method;

(2) back exposure in which the layer of the resin composition is exposed for a short period of time to actinic rays which are emitted from upper light source 7 to form a thin cured layer of the resin composition having a uniform thickness in the resin layer over the entire area facing support 9;

(3) relief exposure in which the resin composition layer is exposed to actinic rays which are emitted from lower light source 8 through the transmitting pattern 2a (image pattern) of image-bearing transparency 2 to form a relief portion;

(4) development in which uncured resin composition 10 is removed from cured resin 9, and the uncured resin composition is washed out by nozzle washing or brush washing using a wash-out solution;

(5) post-exposure in water, in which the thus obtained relief plate is completely immersed in water and exposed to actinic rays emitted from a light source to perform a complete curing of the entire plate; and (6) drying in which the resultant relief plate is removed from water and dried by blowing the plate with hot air.

When the thickness of the final photoresin relief plate is 4 mm or more, it is preferred for the above method to further comprise the step of masking exposure before the relief exposure to form a shelf portion which is to be a support for the relief portion which is later formed.

In the above-mentioned method for producing a relief printing plate, as a light source of actinic rays for the exposures, there may be used, for example, a high pressure mercury lamp, an ultra-high pressure mercury lamp, an ultraviolet fluorescent lamp, a carbon arc lamp or a xenon lamp.

Representative examples of image-bearing transparencies used for the formation of a relief include a negative or positive film which is the same type as that for use in a photographic process in which silver salt image is utilized, and a sheet or film which is substantially transparent to actinic rays, such as a plastic film, a plastic sheet, a glass sheet, a cellophane film, a cellophane sheet and a paper sheet, which has an image formed by imagewise masking the surface thereof by the use of a light shielding film which is not transparent to actinic rays.

Representative examples of washing liquids for washing out an uncured resin composition include water; an alcohol; acetone; benzene; toluene; chloroethane; chloroethylene; an aqueous alkali solution, such as an aqueous sodium hydroxide solution, an aqueous sodium carbonate solution, an aqueous sodium phosphate solution, an aqueous sodium tripolyphosphate solution, an aqueous sodium borate solution and an aqueous sodium silicate solution; and an aqueous solution of a surfactant.

As described, the photosensitive resin composition of the present invention comprises, in specific proportions, a liquid photosensitive resin component comprising a urethane prepolymer (comprising a plurality of diol segments linked through a urethane linkage) and an addition-polymerizable ethylenically unsaturated monomer; a photopolymerization initiator; a thermal polymerization inhibitor; and a specific unsaturated amine compound. The composition of the present invention has excellent characteristics such that it does not suffer from the occurrence of the tunnel phenomenon which is frequently observed in relief formation using the conventional photosensitive resin composition, so that a photoresin relief structure having no tunnel and having excellent mechanical properties can be obtained. Therefore, the photosensitive resin composition of the present invention can advantageously be employed for the production of various printing plates, molds, and other relief articles.

DETAILED DESCRIPTION OF PREFERRED EMBODIMENTS

The present invention will now be described in greater detail with reference to the following Reference Examples, Examples, Comparative Examples, Application Examples and Comparative Application Examples, which should not be construed as limiting the scope of the present invention.

REFERENCE EXAMPLE 1

(Production of Prepolymer A)

0.5 mole of polypropylene adipate diol ($\overline{Mn}$:2.0×10$^3$) and 1 mole of tolylene diisocyanate (hereinafter referred to as "TDI") (2,4-TDI/2,6-TDI molar ratio=4/1) are mixed and the resultant mixture is reacted at about 70° C. for 2 hours to form a polymer having an NCO (isocyanate) group at its both terminals. Herein, the fact that a polymer has an NCO group at its both terminals, is confirmed from the amount of the NCO group consumed (the same confirmation technique as used in this step applies to the subsequent step and the subsequent Reference Examples as well). To the resultant reaction mixture are added 0.25 mole of polyoxyethylene-propylene glycol (EO/PO molar ratio: ½, $\overline{Mn}$: 2.5×10$^3$) and 0.1 g of dibutyltin dilaurate (hereinafter referred to as "BTL") as a catalyst, and reacted at about 70° C. for 4 hours, thereby obtaining a precursor prepolymer having an NCO group at its both terminals.

To the resultant reaction mixture is added 1 mole of 2-hydroxypropyl methacrylate. The mixture is heated at 80° C. to advance a reaction while flowing a dry nitrogen gas. The reaction is conducted until the absorbance at 2260 cm$^{-1}$ of the mixture as measured by infrared (IR) spectrophotometry, which absorbance is specific for an isocyanate group, becomes substantially zero. Thus, there is obtained Prepolymer A ($\overline{Mn}$: 7.5×10$^3$).

REFERENCE EXAMPLE 2

(Production of Prepolymer A2)

1 mole of ε-caprolactone polyester diol ($\overline{Mn}$: 1.0×10$^3$) and 2 moles of hexamethylene diisocyanate (hereinafter referred to as "HMDI") is reacted in the same manner as in Reference Example 1 to form a polymer having NCO groups at its both terminals. To the resultant reaction mixture are added 0.5 mole of polyoxypropylene glycol ($\overline{Mn}$: 3.0×10$^3$) and 0.1 g of BTL and reacted in the same manner as in Reference Example 1, thereby obtaining a precursor prepolymer having NCO groups at its both terminals. To the resultant reaction mixture is added 1 mole of polyoxypropylene glycol ($\overline{Mn}$: 4.0×10$^2$) monomethacrylate, and reacted in the same manner as in Reference Example 1, to thereby obtain Prepolymer A2 ($\overline{Mn}$: 6.5×10$^3$).

REFERENCE EXAMPLE 3

(Production of Prepolymer A3)

1 mole of polyoxyethylene-propylene glycol (EO/PO molar ratio: $\frac{1}{4}$, $\overline{Mn}$: $2.5 \times 10^3$), 1 mole of polypropylene adipate diol ($\overline{Mn}$: $2.5 \times 10^3$) and 0.4 g of BTL are mixed uniformly. To the resultant mixture is added 2.32 moles of TDI of the same type as employed in Reference Example 1, and reacted at about 80° C. while stirring, thereby obtaining a precursor prepolymer having NCO groups at its both terminals. Then, 2 moles of polyoxypropylene glycol ($\overline{Mn}$: $4.0 \times 10^2$) monomethacrylate is added thereto and reacted at about 80° C. while stirring, and the reaction is conducted until the absorbance at 2260 cm$^{-1}$ of the mixture as measured by infrared (IR) spectrophotometry, which absorbance is specific for an isocyanate group, becomes substantially zero, thereby obtaining Prepolymer A3.

The thus obtained Prepolymer A3 has a number average molecular weight ($\overline{Mn}$) of $1.7 \times 10^4$. When Prepolymer A3 is chemically decomposed and analyzed by nuclear magnetic resonance (NMR) and gel permeation chromatography (GPC), it is found that Prepolymer A3 comprises a plurality of diol segments comprising at least one polyester diol residue and at least one polyether diol residue.

EXAMPLES 1 TO 4 AND COMPARATIVE EXAMPLES 1 TO 3

Photosensitive resin compositions are prepared using Prepolymers A1 to A3 in accordance with the formulations indicated in Tables 1 and 2. In all of the compositions, 2,6-di-t-butyl-p-cresol is used in an amount of 0.1% by weight based on the weight of component (A).

The composition of Comparative Example 2, in which N,N-diethylaminoethyl methacrylate is incorporated in an amount of 10% by weight based on the weight of component (A), has untolerably strong amine smell, and the cured resin obtained therefrom also disadvantageously has the same strong smell.

COMPARATIVE EXAMPLE 4

5 moles of terephthalic acid, 1 mole of propylene glycol and 4.1 moles of diethylene glycol are reacted at about 150° C. under atmospheric pressure until the degree of conversion as measured from the amount of the water formed, reaches 80%, and then reacted under vacuum while heating up to about 200° C., thereby obtaining an oligoester having an acid value of 30. Then, ethylene glycol is added thereto in an amount 3 times the equivalent amount, as measured from the acid value, of carboxyl groups and reacted until the acid value is 0.5, followed by distilling off the excess ethylene glycol, thereby to obtain aromatic oligoester diol having a hydroxyl group at both terminals thereof. The thus obtained ester diol has a number average molecular weight ($\overline{Mn}$) of about $1.8 \times 10^3$, as measured by GPC.

Substantially the same procedure as in Reference Example 3 is conducted except that the above-obtained aromatic oligoester giol is employed in place of polypropylene adipate diol, thereby obtaining a prepolymer having a number average molecular weight ($\overline{Mn}$) of $1.65 \times 10^4$ (hereinafter referred to as "Prepolymer A4").

A photosensitive resin composition is prepared in accordance with substantially the same formulation as in Example 3 except that the above-obtained Prepolymer A4 is employed in place of Prepolymer A3.

COMPARATIVE EXAMPLE 5

0.4 mole of polyoxyethylene-propylene glycol of the same type as employed in Reference Example 3, 1.6 moles of an aromatic oligoester of the same type as employed in Comparative Example 4 and 0.4 g of dibutyltin dilaurate (BTL) are mixed uniformly, and then 2.32 moles of HMDI is added thereto, followed by reaction at about 80° C., to thereby obtain a precursor prepolymer having an NCO group at both terminals thereof. To the resultant reaction mixture is added 2 moles of polyoxyethylene glycol ($\overline{Mn}$: $4.0 \times 10^2$) monomethacrylate and reacted in the same manner as in Reference Example 3, thereby obtaining a prepolymer (Prepolymer A5). Prepolymer A5 has a number average molecular weight of $1.1 \times 10^4$.

A photosensitive resin composition is prepared using substantially the same formulation as in Example 3 except that the above-obtained Prepolymer A5 is employed in place of Prepolymer A3. The resin composition of Comparative Example 5 disadvantageously has a viscosity as high as 900 poises/20° C.

TABLE 1

| | | Component (A) | | Component (B) | |
| | | Addition-polymerizable ethylenically unsaturated monomer | | Photopolymerization initiator | |
| Examples | Type of urethane prepolymer | Type | Amount, wt % based on weight of prepolymer | Type | Amount, wt % based on weight of component (A) |
| --- | --- | --- | --- | --- | --- |
| 1 | A1 | Lauryl methacrylate: | 10 | Benzoin isobutyl ether | 1 |
| | | 2-Hydroxypropyl methacrylate: | 20 | | |
| | | Tetraethylene glycol dimethacrylate: | 5 | | |
| 2 | A2 | Polyoxypropylene glycol (Mn ≈ $4.0 \times 10^2$) monomethacrylate: | 25 | 2,2-dimethoxy-2-phenylacetophenone | 0.6 |
| | | 2-Hydroxyethyl methacrylate: | 10 | | |
| | | Trimethylolpropane trimethacrylate: | 10 | | |
| 3 | A3 | Lauryl methacrylate: | 20 | 2,2-dimethoxy-2-phenylacetophenone | 0.5 |
| | | Polyoxypropylene glycol (Mn ≈ $4.0 \times 10^2$) monomethacrylate: | 20 | | |
| | | Tetraethylene | 5 | | |

TABLE 1-continued

| Examples | Type | | Amount, wt % based on weight of prepolymer | Type | Amount, wt % based on weight of component (A) |
|---|---|---|---|---|---|
| | | glycol dimethacrylate: | | | |
| | | 2-Hydroxypropyl methacrylate: | 5 | | |
| 4 | A3 | Stearyl methacrylate: | 15 | 2,2-dimethoxy-2-phenylacetophenone | 0.55 |
| | | Polyoxypropylene glycol (Mn ≈ 4.0 × $10^2$) monomethacrylate: | 20 | | |
| | | Triethanolpropane trimethacrylate: | 7 | | |
| | | Diethylene glycol 2-ethylhexyl ether acrylate: | 13 | | |
| | | 2-Hydroxypropyl methacrylate: | 5 | | |

| | Component (C) Thermal polymerization inhibitor | | Component (D) Unsaturated amine compound | | Additives | |
|---|---|---|---|---|---|---|
| Examples | Type | Amount, wt % based on weight of component (A) | Type | Amount, wt % based on weight of component (A) | Type | Amount, wt % based on weight of component (A) |
| Examples | | | | | | |
| 1 | 2,6-di-t-butyl-p-cresol | 0.1 | N,N-dimethylaminoethyl acrylate | 0.5 | — | — |
| 2 | 2,6-di-t-butyl-p-cresol | 0.1 | N,N-diethylaminopropyl methacrylate | 1 | Palmitic acid | 1.5 |
| 3 | 2,6-di-t-butyl-p-cresol | 0.1 | N,N-diethylaminoethyl methacrylate | 1.5 | Myristic acid | 2.5 |
| | | | | | Dimyristyl thiodipropionate | 1.5 |
| 4 | 2,6-di-t-butyl-p-cresol | 0.1 | N,N-dimethylaminoethyl methacrylate | 2 | Myristic acid | 2 |
| | | | | | Dimyristyl thiodipropionate | 1.5 |
| | | | | | Triethanolamine | 0.07 |

Note:
When the urethane prepolymer is produced, a terminal-vinylating agent is used in an excess amount over the stoichiometrial amount. Accordingly, the indicated amount of addition-polymerizable ethylenically unsaturated monomer used is such that an additional amount corresponding to the excess amount of the terminal-vinylating agent is added to the stoichiometrical amount.

TABLE 2

| | | Component (A) | | Component (B) | |
|---|---|---|---|---|---|
| | | Addition-polymerizable ethylenically unsaturated monomer | | Photopolymerization initiator | |
| Comparative Examples | Type of urethane prepolymer | Type | Amount, wt % based on weight of prepolymer | Type | Amount, wt % based on weight of component (A) |
| 1 | A-3 | Stearyl methacrylate: | 15 | 2,2-dimethoxy-2-phenylacetone | 0.55 |
| | | Polyoxypropylene glycol (Mn ≈ 4.0 × $10^2$) monomethacrylate: | 20 | | |
| | | Triethanolpropane trimethacrylate: | 7 | | |
| | | Diethylene glycol 2-ethylhexyl ether acrylate: | 13 | | |
| | | 2-Hydroxypropyl methacrylate: | 5 | | |
| 2 | A3 | Lauryl methacrylate: | 20 | 2,2-dimethoxy-2-phenylacetophenone | 0.5 |
| | | Polyoxypropylene glycol (Mn ≈ 4.0 × $10^2$) monomethacrylate: | 20 | | |
| | | Tetraethylene glycol dimethacrylate: | 5 | | |
| | | 2-Hydroxypropyl methacrylate: | 5 | | |
| 3 | A2 | Polyoxypropylene glycol (Mn ≈ 4.0 × $10^2$) monomethacrylate: | 25 | 2,2-dimethoxy-2-phenylacetophenone | 0.6 |
| | | 2-Hydroxyethyl | 10 | | |

TABLE 2-continued

|  |  | methacrylate: Trimethylolpropane trimethacrylate: | 10 |  |  |
|---|---|---|---|---|---|

| | Component (C)<br>Thermal polymeri-<br>zation inhibitor | | Component (D)<br>Unsaturated amine<br>compound | | Additives | |
|---|---|---|---|---|---|---|
| Com-<br>parative<br>Examples | Type | Amount, wt %<br>based on<br>weight of<br>component (A) | Type | Amount, wt %<br>based on<br>weight of<br>component (A) | Type | Amount, wt %<br>based on<br>weight of<br>component (A) |
| 1 | 2,6-di-<br>t-butyl-<br>p-cresol | 0.1 | — | — | Myristic acid<br>Dimyristyl<br>thiodipropion-<br>ate<br>Triethanol-<br>amine | 2<br>1.5<br><br>0.07 |
| 2 | 2,6-di-<br>t-butyl-<br>p-cresol | 0.1 | N,N-diethy-<br>aminoethyl<br>methacrylate | 10 | Myristic acid<br>Dimyristyl<br>thiodipropion-<br>ate | 2.5<br>1.5 |
| 3 | 2,6-di-<br>t-butyl-<br>p-cresol | 0.1 | — | — | Palmitic acid | 1.5 |

Note:
When the urethane prepolymer is produced, a terminal-vinylating agent is used in an excess amount over the stoichiometrial amount.
Accordingly, the indicated amount of addition-polymerizable ethylenically unsaturated monomer used is such that an additional amount corresponding to the excess amount of the terminal-vinylating agent is added to the stoichiometrical amount.

APPLICATION EXAMPLE 1

Production of a relief printing plate is conducted using a light-exposure apparatus having upper glass plate 6 and upper light source 7 which are disposed in parallel to each other and having lower glass plate 1 and lower light source 8 which are disposed in parallel to each other, as shown in FIG. 1.

The upper and lower glass plates each have a thickness of about 20 mm and are made of pyrex glass. The lower surface of upper glass plate 6, which is to face support 5, is in a roughened state and has a groove for evacuation provided thereon along the periphery, and the upper surface of lower glass plate 1, which is to face negative film 2, also is in a roughened state and has a groove for evacuation provided thereon along the periphery. The upper light source is comprised of chemical lamps having a maximum emitting wave length ($\lambda$max) of about 370 nm, and has an average light source intensity of 3.5 m W/cm$^2$ as measured by UV-M01 (Sensor UV-35) manufactured and sold by ORC Manufacturing Co., Ltd., Japan. The lower light source is comprised of chemical lamps having a maximum emitting wave length ($\lambda$max) of about 370 nm, and has an average light source intensity of 6.0 mW/cm$^2$ as measured by the above-mentioned UV-M01.

A negative film 2 which bears a negative pattern for corrugated board printing including a fine line image which is likely to suffer from the tunnel phenomenon, is disposed on lower glass plate 1, and a 30 $\mu$m-thick cover film of polypropylene is placed over the negative film, followed by pressing cover film 3 and negative film 2 against lower glass plate 1 by evacuation. Then, spacer 4 having a thickness of 7 mm is disposed on cover film 3 along its periphery.

The photosensitive resin composition obtained in Example 4 is heated to about 30° C. and poured into a bottom-open type bucket having doctor means and supported and driven by a carriage. The resin composition in the bucket is poured in the cavity formed by spacer 4 over cover film 3, and transparent support film 5 of polyethylene terephthalate (PET) having a thickness of 100 $\mu$m and having an adhesive layer formed on one surface thereof is laminated on the poured resin composition so that the adhesive layer faces the resin composition.

Subsequently, an upper light source box which contains upper glass plate 6 and upper light source 7 is pulled down, so that upper glass plate 6 is pressed against support 5 to adjust the thickness of the photosensitive resin layer to a desired thickness defined by the thickness of the spacer 4. The resultant photosensitive resin layer having the desired thickness is irradiated with actinic rays emitted from the upper light source 7 for 80 seconds, thereby effecting back exposure to control the relief depth, and then irradiated with actinic rays emitted from lower light source 8 for 250 seconds, to thereby effect imagewise exposure for forming a relief. The total amount of irradiated actinic rays in the above exposures is selected so that the resin composition does not undergo excessive exposure.

After the imagewise exposure, cover film 3 is removed from the cured resin layer and the uncured resin is removed by a spatula, followed by washing-out of any remaining uncured resin by spraying over the plate on the side of the relief a 40° C. developer containing 1 wt % surfactant for a period of about 6 minutes. Further, the thus obtained plate is immersed in water and exposed to actinic rays from the relief side for 10 minutes using a chemical lamp having a maximum emitting wave length ($\lambda$max) of 370 nm and an average light source intensity of 3.0 mW/cm$^2$, followed by drying of the plate with hot air at 60° C. for 15 minutes.

Thus, a relief printing plate suitable for corrugated board printing which has an excellent relief structure is obtained (plate thickness: 7 mm). Using this relief printing plate, corrugated board printing is conducted under conditions such that the printing speed is 80 sheets per minute, an aqueous ink having a viscosity of 13" (Zahn Cup #4) is used and the type of the corrugated board sheets is A-flute (liner class C-210) (JIS Z1516 and JIS P3902). As a result, good impressions are obtained with no staining of the areas which are not to be coated with the ink, indicating that the depth of the relief is sufficient. Further, since the printing plate has a large relief depth as compared with the conventional printing plate, the printing plate is light in weight, so that the efficiency of the printing operation is also improved.

In order to evaluate the capability for the photosensitive resin composition to form a relief structure without suffering from the tunnel phenomenon, substantially the same procedure as described above is repeated to form relief structures having varied relief depths, to thereby determine a minimum value of relief depth at which the tunnel phenomenon occurs with respect to the photosensitive resin composition. This minimum value of relief depth of the photosensitive resin composition of Example 4 is as large as 3.5 mm.

COMPARATIVE APPLICATION EXAMPLE 1

Substantially the same procedure as in Application Example 1 is conducted except that the photosensitive resin composition obtained in Comparative Example 1 is employed and that the relief exposure and the back exposure are conducted for 400 seconds and 190 seconds, respectively, thereby obtaining a printing plate having a relief depth of only 1.5 mm with respect to fine line image portions.

Printing is performed under the same conditions as in Application Example 1, using the thus obtained printing plate which has a relief depth of only 1.5 mm, to obtain impressions. In the impressions, staining of the areas which are not to be coated with ink is observed, indicating that the relief depth is too small so that the ink has disadvantageously adhered to some portions of the surface of the back layer and transferred to corrugated board sheets.

With respect to the photosensitive resin composition of Comparative Example 1, in substantially the same manner as described in Application Example 1, a maximum value of relief depth which can be obtained with no occurrence of the tunnel phenomenon in fine line image portions is measured. The maximum value is disadvantageously only 1.5 mm.

APPLICATION EXAMPLE 2

Substantially the same procedure as in Application Example 1 is conducted except that the photosensitive resin composition obtained in Example 2 is employed, that the width of the spacer (that is, the thickness of the photoresin layer) is 10 mm, that a negative film bearing a pattern for a manhole cover is used, and that the relief exposure is conducted for 310 seconds but back exposure is not conducted.

As a result, a mold for producing a manhole cover, which has a relief depth as large as 9.9 mm and a total mold thickness of 10 mm is obtained without occurrence of the tunnel phenomenon in fine line image and fine letter image portions.

COMPARATIVE APPLICATION EXAMPLE 2

Substantially the same procedure as in Application Example 2 is conducted except that the photosensitive resin composition obtained in Comparative Example 3 is employed and that relief exposure is conducted for 560 seconds, thereby obtaining a mold for producing a manhole cover. The thus obtained mold disadvantageously has tunnels in fine line relief portions so that it cannot be used as a mold.

When the time for relief exposure is further increased, the tunnel phenomenon is suppressed to some extent, but not completely suppressed. When the time for relief exposure is still further increased to cause excessive exposure, not only is the tunnel phenomenon not completely suppressed, but also the fine-line relief portions undergo great broadening and the relief portions, which should be formed independently from each other on the support because no back exposure has been performed, are linked with a photoresin layer unintentionally formed over the support. Thus, this mold cannot be used practically.

COMPARATIVE APPLICATION EXAMPLE 3

Substantially the same procedure as in Application Example 1 is conducted except that the photosensitive resin composition obtained in Comparative Example 2 is employed in place of the resin composition obtained in Example 4 and that relief exposure and back exposure are conducted for 26 seconds and 8.5 seconds, respectively, thereby obtaining a printing plate. Since the resin composition employed is extremely high in photopolymerization rate, the amount of actinic rays used in relief exposure and back exposure is selected so that the amount does not exceed a minimum amount necessary to form fine line relief portions. However, when printing is conducted using the thus obtained printing plate, it is found that in the resultant impressions, reverse fine-line images, which are to be vacant, are not obtained.

Further, the work place is disadvantageously filled with amine smell during the plate production operation, and the printing plate per se also has a strong amine smell.

APPLICATION EXAMPLE 3

Substantially the same procedure as in Application Example 1 is conducted except that the photosensitive resin composition obtained in Example 1 is employed in place of the resin composition obtained in Example 4 and that relief exposure and back exposure are conducted for 260 seconds and 90 seconds, respectively.

Thus, a relief printing plate suitable for corrugated board printing which has an excellent relief structure is obtained (plate thickness: 7 mm). Using this printing plate, corrugated board printing is conducted under the same conditions as in Application Example 1. As a result, good impressions are obtained with no staining of the areas which are not to be coated with the ink, indicating that the depth of the relief is sufficient.

In substantially the same manner as described in Application Example 1, a minimum value of relief depth at which the tunnel phenomenon occurs is measured. This minimum value of relief depth of the photosensitive resin composition of Example 4 is as large as 3.5 mm.

APPLICATION EXAMPLE 4 AND COMPARATIVE APPLICATION EXAMPLE 4

The viscosity of the photosensitive resin composition of Example 3 and that of the composition of Comparative Example 4 are measured. It is found that the composition of Comparative Example 4 disadvantageously has a viscosity as high as 1200 poises/20° C., whereas the composition of Example 3 has a viscosity of 500 poises/20° C.

Plain photoresin plates having a thickness of 7 mm are individually prepared from the compositions of Example 3 and Comparative Example 4 under operation conditions such that a light source having a maximum emitting wave length ($\lambda$max) of about 370 nm and an average light source intensity of 3.7 mW/cm$^2$ are employed, and light exposure is conducted for 15 minutes with respect to each surface of a plate.

With respect to each of the above-obtained plates, shore A hardness is measured. As a result, it is found that the plate prepared from the composition of Example 3 has an initial value of 45° and a 60-second value of 35°, whereas the plate prepared from the composition of Comparative Example 4 is too hard to be measured by a shore A hardness meter. (Herein, "initial value" means a value at the moment when the needle of the hardness meter contacts the surface of the plate and "60-second value" means a value 60 seconds after the needle contacts the surface of the plate.) When the shore D hardness of the plate prepared from the composition of Comparative Example 4 is measured, it is found that the plate has an initial value and a 60-second value which are as high as 30° and 20°, respectively.

Substantially the same procedure as in Application Example 1 is conducted except that the photosensitive resin composition of Comparative Example 4 is employed in place of the photosensitive resin composition of Example 4. For complete deaeration of the resin composition, it takes more than 4 days at 50° C. (whereas the resin composition of Example 4 employed in Application Example 1 can be completely deaerated by allowing it to stand overnight at 30° C.). For forming a photosensitive resin layer, the resin composition of Comparative Example 4 is heated to 45° to 50° C. which is 15° to 20° C. higher than the temperature as in the Application Example 1. After the light exposure, an attempt is made to remove the uncured resin by means of a spatula, but the uncured resin cannot be easily removed from the relief due to the high consistency of the uncured resin, differing from the resin composition of Example 4 employed in Application Example 1 which can be readily removed from the relief. Even after the washing by spraying a washing solution, the remainder of the uncured resin adheres to almost entire surface of the relief side of the plate. Further, with respect to the composition of Comparative Example 4, the maximum value of relief depth which can be obtained without the occurrence of the tunnel phenomenon is disadvantageously only 1.7 mm.

COMPARATIVE APPLICATION EXAMPLE 5

Substantially the same procedure as in Application Example 1 is conducted except that the photosensitive resin composition of Comparative Example 5 is employed, thereby obtaining a printing plate. The maximum value of relief depth which can be obtained with no occurrence of the tunnel phenomenon in fine line image portions is disadvantageously only 1.8 mm.

What is claimed is:

1. A photosensitive resin composition for use in forming a relief structure, comprising:

(A) a liquid photosensitive resin component comprising:
  (a) 100 parts by weight of a urethane prepolymer comprising a plurality of diol segments linked through a urethane linkage and having an addition-polymerizable ethylenically unsaturated group at both terminals thereof, said plurality of diol segments comprising at least one polyoxyalkylene diol segment and at least one saturated polyester diol segments, said urethane prepolymer having a number average molecular weight of from $2.0 \times 10^3$ to $3.0 \times 10^4$, and
  (b) 10 to 200 parts by weight, relative to 100 parts by weight of said urethane prepolymer (a), of an addition-polymerizable ethylenically unsaturated monomer,
(B) 0.1 to 10 parts by weight, relative to 100 parts by weight of said resin component (A), of a photopolymerization initiator,
(C) 0.01 to 5 parts by weight, relative to 100 parts by weight of said resin component (A), of a thermal polymerization inhibitor; and
(D) 0.1 to 5 parts by weight, relative to 100 parts by weight of said resin component (A), of at least one unsaturated amine compound represented by the formula:

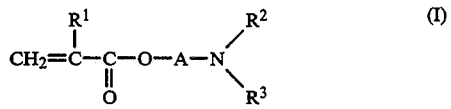

wherein $R^1$ represents a hydrogen atom or a methyl group, $R^2$ and $R^3$ each represents an alkyl group, and A represents a straight chain or branched alkylene group,
said photosensitive resin composition being for use in forming a relief structure which has a relief depth of greater than 1.5 mm and is free of a tunnel void.

2. The photosensitive resin composition according to claim 1, wherein said polyoxyalkylene diol segment is derived from a polyoxyalkylene diol having a number average molecular weight of from $5.0 \times 10^2$ to $5.0 \times 10^3$.

3. The photosensitive resin composition according to claim 1, wherein said saturated polyester diol segment is derived from a saturated polyester diol having a number average molecular weight of from $5.0 \times 10^2$ to $5.0 \times 10^3$.

4. The photosensitive resin composition according to claim 1, wherein said alkyl group of the unsaturated amine compound (D) has 1 to 10 carbon atoms.

5. The photosensitive resin composition according to claim 1, wherein said alkylene group A of the unsaturated amine compound (D) has 1 to 10 carbon atoms.

6. A printing plate produced from the photosensitive resin composition of claim 1.

* * * * *